United States Patent
Su et al.

(10) Patent No.: US 11,171,160 B2
(45) Date of Patent: Nov. 9, 2021

(54) ARRAY SUBSTRATE, MANUFACTURING METHOD THEREOF, AND DISPLAY PANEL

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Lei Su, Beijing (CN); Zhengdong Zhang, Beijing (CN); Gang Zhou, Beijing (CN); Xiaofei Yang, Beijing (CN); Ke Dai, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 755 days.

(21) Appl. No.: 16/063,885

(22) PCT Filed: Dec. 18, 2017

(86) PCT No.: PCT/CN2017/116952
§ 371 (c)(1),
(2) Date: Jun. 19, 2018

(87) PCT Pub. No.: WO2018/137441
PCT Pub. Date: Aug. 2, 2018

(65) Prior Publication Data
US 2021/0202529 A1 Jul. 1, 2021

(30) Foreign Application Priority Data
Jan. 25, 2017 (CN) .......................... 201710061083.9

(51) Int. Cl.
*H01L 27/12* (2006.01)

(52) U.S. Cl.
CPC .......... *H01L 27/124* (2013.01); *H01L 27/127* (2013.01); *H01L 27/1237* (2013.01)

(58) Field of Classification Search
CPC .. H01L 27/124; H01L 27/127; H01L 27/1237
See application file for complete search history.

(56) References Cited

U.S. PATENT DOCUMENTS

| 8,927,983 B2 | 1/2015 | Tang et al. |
| 9,627,419 B2 | 4/2017 | Park et al. |

(Continued)

FOREIGN PATENT DOCUMENTS

| CN | 102650784 A | 8/2012 |
| CN | 103094276 A | 5/2013 |

(Continued)

OTHER PUBLICATIONS

Second Chinese Office Action Application No. 201710061083.9; dated Oct. 26, 2020.

(Continued)

*Primary Examiner* — Dung A. Le

(57) ABSTRACT

An array substrate, a method of manufacturing the same, and a display panel are provided. The method includes: providing a base substrate including a display area and a wiring area at a periphery of the display area; in the process of forming a connection electrode in the wiring area, remaining a first photoresist layer for performing the patterning process and covering the connection electrode; depositing a film of reflective pixel electrode layer on the base substrate and performing a patterning process on the film of reflective pixel electrode layer to form a reflective pixel electrode layer in the display area and to remove the film of reflective pixel electrode layer in the wiring area to expose the first photoresist layer; removing a second photoresist layer for patterning the thin film of reflective pixel electrode layer on (Continued)

the reflective pixel electrode layer with the first photoresist layer in the wiring area.

18 Claims, 11 Drawing Sheets

(56) References Cited

U.S. PATENT DOCUMENTS

| | | | |
|---|---|---|---|
| 2003/0165718 | A1 | 9/2003 | Hsu et al. |
| 2005/0110023 | A1* | 5/2005 | Lee ................... H01L 27/124 257/72 |
| 2009/0091675 | A1* | 4/2009 | Park ................ G02F 1/134309 349/43 |
| 2013/0009162 | A1* | 1/2013 | Kang ................ H01L 27/3246 257/72 |
| 2017/0025447 | A1* | 1/2017 | Park .................... H01L 27/1222 |
| 2018/0284499 | A1 | 10/2018 | Yamazaki et al. |

FOREIGN PATENT DOCUMENTS

| | | |
|---|---|---|
| CN | 103293727 A | 9/2013 |
| CN | 103728757 A | 4/2014 |
| CN | 203561812 U | 4/2014 |
| CN | 104516140 A | 4/2015 |
| CN | 104538356 A | 4/2015 |

OTHER PUBLICATIONS

International Search Report and Written Opinion dated Mar. 20, 2018; PCT/CN2017/116952.
First Chinese Office Action dated Mar. 31, 2020; Appln. No. 201710061083.9.

* cited by examiner

ARRAY SUBSTRATE, MANUFACTURING METHOD THEREOF, AND DISPLAY PANEL

The present disclosure claims priority of Chinese Patent Application No. 201710061083.9 filed on Jan. 25, 2017, the disclosure of which is hereby entirely incorporated by reference as a part of the present disclosure.

TECHNICAL FIELD

At least one embodiment of the present disclosure relates to an array substrate, a manufacturing method thereof, and a display panel.

BACKGROUND

A display panel manufactured by a total-reflection array substrate may not require backlight during display. By preparing, for example, a metal reflective pixel electrode layer on a surface of the array substrate, light incident from an external environment can be reflected for image display. Thus, a light and thin display panel with low weight and low power consumption can be achieved.

SUMMARY

At least one embodiment of the present disclosure provides a manufacturing method of array substrate, comprising: providing a base substrate which comprises a display area and a wiring area located at a periphery of the display area; forming a contact pad in the wiring area; forming a source/drain electrode layer in the display area on the base substrate; depositing a film of connection electrode layer on the base substrate and performing a patterning process on the film of connection electrode layer to form a connection electrode in the wiring area on the base substrate, with a first photoresist layer for performing the patterning process and covering the connection electrode remained; depositing a film of reflective pixel electrode layer on the base substrate, performing a patterning process on the film of reflective pixel electrode layer to form a reflective pixel electrode layer in the display area, and removing the film of reflective pixel electrode layer in the wiring area to expose the first photoresist layer; and removing a second photoresist layer for patterning the film of reflective pixel electrode layer on the reflective pixel electrode layer and the first photoresist layer in the wiring area; wherein the reflective pixel electrode layer is electrically connected with the source/drain electrode layer, and the connection electrode is at least partially electrically connected with the contact pad.

For example, the manufacturing method according to at least one embodiment of the present disclosure further comprises forming a passivation layer on the source/drain electrode layer on the base substrate, and then patterning the passivation layer so as to form in the passivation layer a first via located in the display area and a second via located in the wiring area; wherein the source/drain electrode layer and the reflective pixel electrode layer are electrically connected with each other through the first via, and the connection electrode and the contact pad are electrically connected with each other through the second via.

For example, the manufacturing method according to at least one embodiment of the present disclosure further comprises forming a signal line in the wiring area when forming the source/drain electrode layer on the gate electrode in the display are; and forming a third via in the passivation layer in the wiring area, the connection electrode being electrically connected with the signal line through the third via.

For example, in the manufacturing method according to at least one embodiment of the present disclosure, the signal line is formed to be electrically connected with the contact pad through the connection electrode.

For example, in the manufacturing method according to at least one embodiment of the present disclosure, the signal line is formed to be at least one of a gate line, a data line, a common electrode line, a power line, a ground line, a frame start scan line, and a reset line.

For example, the manufacturing method according to at least one embodiment of the present disclosure further comprises forming a gate insulating layer on the contact pad, the source/drain electrode layer being formed on the gate insulating layer; and forming a fourth via in the gate insulating layer exposing the contact pad when forming the second via in the passivation layer, the connection electrode being electrically connected with the contact pad through the second via and the fourth via.

For example, the manufacturing method according to at least one embodiment of the present disclosure further comprises forming an active layer on the gate insulating layer, and then forming the source/drain electrode layer on the active layer.

For example, the manufacturing method according to at least one embodiment of the present disclosure further comprises forming the gate electrode layer in the display area on the base substrate, and forming the gate electrode layer and the contact pad through one patterning process.

At least one embodiment of the present disclosure provides an array substrate, comprising: a base substrate comprising a display area and a wiring area located at a periphery of the display area; a source/drain electrode layer located on the base substrate in the display area; a reflective pixel electrode layer located in the display area and provided on the source/drain electrode layer; a contact pad located in the wiring area; and a connection electrode located in the wiring area, the connection electrode being provided on the contact pad; wherein the reflective pixel electrode layer is electrically connected with the source/drain electrode layer, the connection electrode is at least partially electrically connected with the contact pad, and the reflective pixel electrode layer and the connection electrode are made of different materials.

For example, in the array substrate according to at least one embodiment of the present disclosure, material of the connection electrode comprises a transparent conductive material.

For example, in the array substrate according to at least one embodiment of the present disclosure, a gate electrode layer is further formed in the display area on the base substrate.

For example, the array substrate according to at least one embodiment of the present disclosure further comprises a passivation layer disposed on the base substrate, wherein a portion of the passivation layer in the display area is positioned between the reflective pixel electrode layer and the source/drain electrode layer, and a portion of the passivation layer in the wiring area is positioned between the connection electrode and the contact pad.

For example, in the array substrate according to at least one embodiment of the present disclosure, a first via is provided in the passivation layer in the display area, and the source/drain electrode layer and the reflective pixel electrode layer are electrically connected with each other through the first via, and a second via is provided in the passivation layer in the wiring area, and the connection electrode is formed on the passivation layer and is electrically connected with the contact pad through the second via.

For example, the array substrate according to at least one embodiment of the present disclosure further comprises a signal line disposed between the passivation layer and the base substrate in the wiring area, wherein a third via is provided in the passivation layer in the wiring area, and the connection electrode is electrically connected with the signal line through the third via.

For example, in the array substrate according to at least one embodiment of the present disclosure, the source/drain electrode layer and the signal line are provided in the same layer.

For example, the array substrate according to at least one embodiment of the present disclosure further comprises comprising a gate insulating layer provided on the base substrate, wherein the gate insulating layer located in the display area is disposed between the gate electrode layer and the source/drain electrode layer, and the gate insulating layer located in the wiring area is disposed between the contact pad and the signal line.

For example, in the array substrate according to at least one embodiment of the present disclosure, a fourth via is provided in the gate insulating layer in the wiring area, the fourth via exposes the contact pad and is communicated with the second via, and the connection electrode is electrically connected with the contact pad through the second via and the fourth via.

For example, in the array substrate according to at least one embodiment of the present disclosure, a gate electrode layer is further formed in the display area on the base substrate, and the gate electrode layer and the contact pad are disposed in the same layer.

At least one embodiment of the present disclosure provides a display panel comprising any one array substrate as described above.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

Figure 1A:
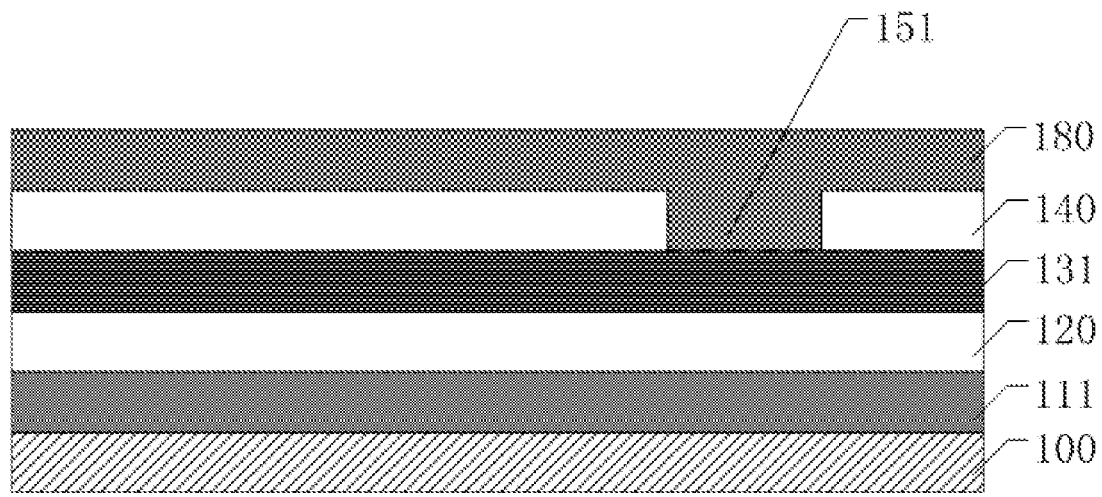
FIG. 1a is a schematic cross-sectional structural view of a display area of an array substrate provided by an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms used herein should have the same meaning as commonly understood by one of ordinary skill in the art. The terms "first", "second" and similar words used in the present disclosure do not denote any order, quantity, or importance, but are merely intended to distinguish different components. Words like "including" or "comprising" and etc. mean that an element or an article before them contains an element/elements or an article/articles listed thereafter, while not excluding other elements or articles. Words such as "connect" or "couple" or the like are not to be limited to physical or mechanical connections, but may include electrical connections, either direct or indirect. Terms of "up", "down", "left", "right" and etc. are merely intended to indicate relative positional relationships. If the absolute position of the described object is changed, the relative positional relationship will be changed accordingly.

A preparation process for the total reflection substrate requires six masking processes, for preparing a gate electrode, an active layer, a source/drain electrode layer, vias, an ITO layer, and a metal reflective pixel electrode layer in sequence. In the process of forming the metal reflective pixel electrode layer, since ITO is not dense enough, the corrosion solution can penetrate the ITO layer in the process of etching the metal layer in a peripheral region, and for example can corrode other components at the vias in the peripheral region (for example, a signal line in the peripheral region). And, the method for preparing a total reflection display substrate has too many steps and the preparation cost is high.

At least one embodiment of the present disclosure provides an array substrate, a method of manufacturing the same, and a display panel. The array substrate comprises a base substrate comprising a display area and a wiring area located at a periphery of the display area; a source/drain electrode layer and a reflective pixel electrode layer sequentially disposed in the display area on the base substrate; and a contact pad and a connection electrode sequentially disposed in the wiring area on the base substrate; the reflective pixel electrode layer electrically connected with the source/drain electrode layer, the connection electrode at least partially electrically connected with the contact pad, and the reflective pixel electrode layer and the connection electrode being made of different materials. The reflective pixel electrode layer can have both functions of being a pixel electrode and being reflective. The connection electrode can lead out the contact pads positioned in different layers, or can communicate the contact pad and the signal line positioned in different layers for signal transmission.

It should be noted that the connection electrode can be a conductive connecting wire. The conductive connecting wire can form a bridge between, for example, elements located in different layers, such as the signal line and the contact pad.

Figure 1B:
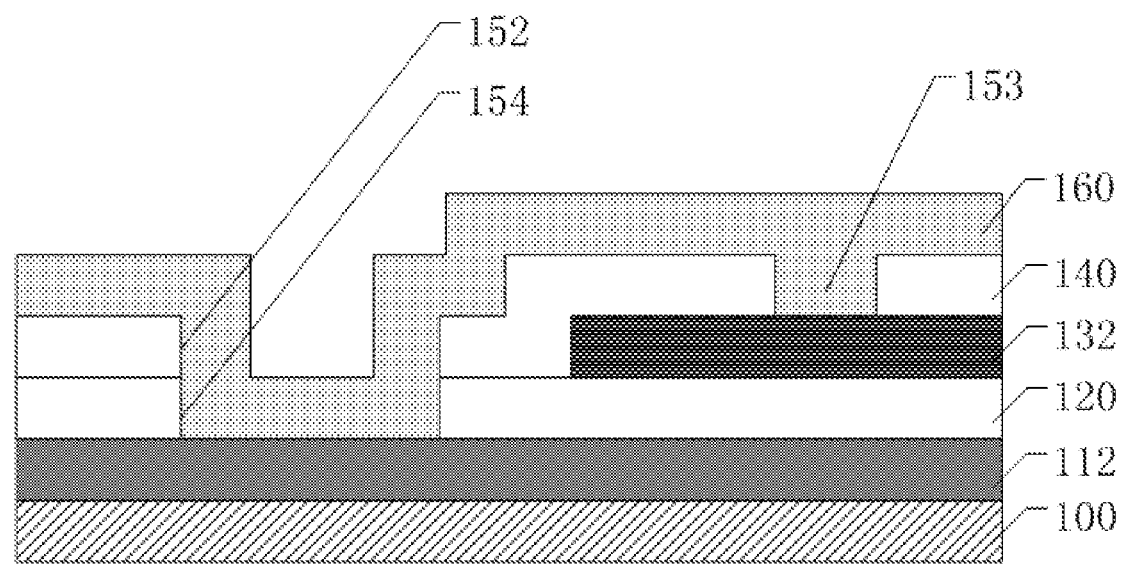
FIG. 1b is a schematic cross-sectional structural view of a wiring area of an array substrate provided by an embodiment of the present disclosure.

For example, in the embodiments of the present disclosure, a gate electrode layer is further provided in the display area on the base substrate. It should be noted that, in some embodiments, the gate electrode layer and the contact pad can be separately provided; and in other embodiments, the gate electrode layer and the contact pad can be structures arranged in the same layer (referring to the corresponding contents of the following embodiments of the present disclosure in detail). The above two kinds of arrangement are irrelevant to the technical solutions of the embodiments of the present disclosure. Therefore, in order to facilitate the explanation of the technical solutions of the disclosure, in the following embodiments of the present disclosure, the description is made by taking the gate electrode layer and the contact pad being arranged in the same layer as an example. An embodiment of the present disclosure provides an array substrate. FIG. 1a is a schematic cross-sectional structural view of a display area of an array substrate according to an embodiment of the present disclosure. FIG. 1b is a schematic cross-sectional structural view of a wiring area of an array substrate according to an embodiment of the present disclosure.

For example, as illustrated in FIG. 1a, in the display area, the array substrate comprises a base substrate 100, a source/drain electrode layer 131, and a reflective pixel electrode layer 180. The reflective pixel electrode layer 180 is electrically connected with the source/drain electrode layer 131. The reflective pixel electrode layer 180 functions as a pixel electrode in the display area and has a reflective function at the same time. The reflective pixel electrode layer 180 can reflect the light incident from the ambient environment, so that the reflected light is emitted from the pixel area corresponding to the reflective pixel electrode layer 180 to achieve image display. As such, it may be unnecessary to provide a device such as a display panel comprising the array substrate with a light source which provides backlight.

For example, as illustrated in FIG. 1b, in the wiring area, the array substrate comprises the base substrate 100, a contact pad 112, a signal line 132, and a connection electrode 160 which is electrically connected with the signal line 132 (e.g., a data line). The connection electrode 160 can connect the contact pad 112 and the signal line 132 located in different layers. For example, the connection electrode 160 can also be electrically connected with a driver.

For example, in at least one embodiment of the present disclosure, the array substrate can further comprise a gate electrode layer 111 disposed in the display area on the base substrate 100. The gate electrode layer 111 and the source/drain electrode layer 131 belong to a thin film transistor acting as a switching element or a driving element in a sub-pixel unit in the display area. The gate electrode layer 111 corresponds to a gate electrode of the thin film transistor, while the source/drain electrode layer 131 corresponds to a source electrode or a drain electrode. The gate electrode is, for example, electrically connected with or integrally formed with a gate line; and one among the source electrode and the drain electrode of the thin film transistor which is not electrically connected with the reflective pixel electrode layer 180 can be electrically connected with the data line or the like.

In FIG. 1b, the connection electrode 160 can connect the contact pad 112 and the signal line 132 located in different layers, however, the embodiments of the present disclosure are not limited thereto. In the wiring area, the contact pad 112 is not electrically connected with the signal line 132 located in a different layer, but is electrically connected with other signal lines (for example, a gate line) located in the same layer, and then is electrically connected with, for example, a driver through the connection electrode 160.

For example, in at least one embodiment of the present disclosure, the signal line is formed as at least one of a gate line, a data line, a common electrode line, a power line, a ground line, a frame start scan line, and a reset line. In at least one embodiment of the present disclosure, the types of the signal line are not limited, as long as the signal line is required to be electrically connected with the contact pad through, for example, the connection electrode.

For example, in at least one embodiment of the present disclosure, as illustrated in FIGS. 1a and 1b, the connection electrode 160 and the reflective pixel electrode layer 180 can be formed of different materials. For example, the connection electrode 160 can be formed prior to the reflective pixel electrode layer 180, that is to say, the connection electrode 160 is firstly formed, for example, through a patterning process, and then the reflective pixel electrode layer 180 is formed through a patterning process. When the connection electrode 160 is formed through, for example, a patterning process, the photoresist layer (for example, a first photoresist layer, not illustrated in the drawings) covered on the connection electrode 160 is not removed. And then, when the reflective pixel electrode layer 180 is formed through the patterning process, a position of the connection electrode 160 where the connection electrode 160 is connected with the contact pad 112 or the signal line 132 is covered by the first photoresist layer. In the process of forming the reflective pixel electrode layer 180, due to the existence of the first photoresist layer, in the wiring area, the corrosion solution for etching the reflective pixel electrode layer 180 would not penetrate through the connection electrode 160 to corrode the contact pad 112 or the signal line 132, so that connections in circuits in the wiring area could be protected.

For example, in the array substrate according to at least one embodiment of the present disclosure, material for preparing the reflective pixel electrode layer 180 is not limited. For example, the material for preparing the reflective pixel electrode layer 180 can comprise a conductive material with reflective function, such as aluminum, silver, gold, chromium, or molybdenum, or the like. For example, the material for preparing the reflective pixel electrode layer 180 can also comprise a conductive material such as indium tin oxide (ITO), indium zinc oxide (IZO), or indium gallium oxide, and the above material is mixed with a metal material particle with reflective function.

For example, in the array substrate according to at least one embodiment of the present disclosure, material for preparing the connection electrode 160 is not limited. For example, the material for preparing the connection electrode 160 can comprise a transparent conductive material. For example, the material for the connection electrode can comprise indium tin oxide (ITO), indium zinc oxide (IZO), indium gallium oxide, gallium zinc oxide, zinc oxide, indium oxide, aluminum zinc oxide, carbon nanotubes, or the like.

The embodiments of the present disclosure do not limit the arrangement relationship between the gate electrode layer 111 and the contact pad 112. For example, in the array substrate according to at least one embodiment of the present disclosure, the gate electrode layer 111 and the contact pad 112 can be arranged for example in a same layer. For example, both of the gate electrode layer 111 and the contact pad 112 can be formed simultaneously by a patterning process after depositing a thin film of gate electrode layer on the base substrate 100, so that the preparation process of the array substrate can be simplified and the cost can be reduced. For example, in at least one embodiment of the present disclosure, the gate electrode layer 111 and the contact pad 112 can be formed by different preparation processes respectively, i.e., the contact pad 112 can be separately provided. In at least one embodiment of the present disclosure, the specific arrangement of the contact pad 112 is not restricted.

It should be noted that in at least one embodiment of the present disclosure, the specific structures of the contact pad, the connection electrode, and the signal line in the array substrate are not restricted, as long as the contact pad is connected with other structures such as the signal line through the connection electrode. For example, in at least one embodiment of the present disclosure, a portion of the signal line located in the display area and a portion of the signal line located in the wiring area can be located in different layers. Exemplarily, as illustrated in FIG. 1*a* and FIG. 1*b*, taking the signal line 132 being a gate line as an example, a portion of the gate line in the display area (not illustrated in the figures) can be integrally formed with the gate electrode layer 111. One end of the gate line in the display area is connected with the gate electrode layer 111, and the other end can be provided as a contact pad 112. The connection electrode 160 can connect the gate lines in different layers. In this way, the preparation process of the array substrate can be simplified and the cost can be reduced. It should be noted that the contact pad can be connected with the signal line in the display area so as to realize a transferred connection between the signal line in the display area and the signal line 132 in the wiring area. The contact pad can be a part of the signal line in the display area, or can be an independent structure so as to be connected with the signal line in the display area, which is not restricted in the embodiments of the present disclosure.

It should be noted that, in at least one embodiment of the present disclosure, the specific positions of the contact pad and the connection electrode in the array substrate are not restricted. For example, the positions of the contact pad and the connection electrode can be selected according to the type of the signal line. For example, the signal line is a gate line, and the contact pad can be a part of the signal line in the display area, that is to say, the contact pad can be disposed in the same layer as the gate electrode. For another example, the signal line is a data line, and the contact pad can be a part of the signal line in the display area, that is to say, the contact pad can be disposed in the same layer as the source/drain electrode layer.

The materials for preparing the gate electrode layer 111 and the contact pad 112 are not limited in the embodiments of the present disclosure. For example, materials for preparing the gate electrode layer or the contact pad can comprise copper (Cu), copper-molybdenum alloy (Cu/Mo), copper-titanium alloy (Cu/Ti), copper-molybdenum-titanium alloy (Cu/Mo/Ti), copper-molybdenum-tungsten alloy (Cu/Mo/W), copper-molybdenum-niobium alloy (Cu/Mo/Nb), and the like. Materials for the gate electrode layer or the contact pad can further be chromium-based metals, for example, chromium-molybdenum alloy (Cr/Mo), chromium-titanium alloy (Cr/Ti), chromium-molybdenum-titanium alloy (Cr/Mo/Ti), and the like. Materials for the gate electrode layer or the contact pad can further be aluminum or aluminum alloy, and the like.

The arrangement relationship between the signal line 132 and the source/drain electrode layer 131 is not limited in the embodiments of the present disclosure. For example, in the array substrate according to at least one embodiment of the present disclosure, the source/drain electrode layer 131 and the signal line 132 can be configured to be in the same layer, for example, both of them can be formed simultaneously through a patterning process after depositing a thin film of source/drain electrode layer on the base substrate, so that the preparation processes of the array substrate can be simplified and the cost can be reduced. For example, in at least one embodiment of the present disclosure, the signal line 132 and the source/drain electrode layer 131 can further be separately formed through different preparation processes.

The specific structures of the signal line 132 and the source/drain electrode layer 131 are not restricted in the embodiments of the present disclosure. For example, material for preparing the source/drain electrode layer 131 or the signal line 132 can be a metal material, and can be of a single-layered or multi-layered structure. For example, the source/drain electrode layer 131 or the signal line 132 can be a single-layered structure of aluminum, a single-layered structure of molybdenum, or a three-layered structure with one layer of aluminum interposed between two layers of molybdenum.

For example, the array substrate according to at least one embodiment of the present disclosure, as illustrated in FIGS. 1*a* and 1*b*, further comprises a passivation layer 140 disposed on the base substrate 100. For example, as illustrated in FIG. 1*a*, a portion of the passivation layer 140 in the display area is positioned between the reflective pixel electrode layer 180 and the source/drain electrode layer 131. For example, as illustrated in FIG. 1*b*, a portion of the passivation layer 140 in the wiring area is positioned between the connection electrode 160 and the contact pad 112. The specific structure and preparation material of the passivation layer 140 are not limited in the embodiments of the present disclosure. For example, the passivation layer 140 can be a single-layered structure or a multi-layered composite structure made of at least one of materials comprising silicon nitride (SiNx) and silicon oxide (SiOx) or the like.

For example, in the array substrate according to at least one embodiment of the present disclosure, as illustrated in FIG. 1*a*, a first via 151 is provided in the passivation layer 140 in the display area, and the source/drain electrode layer 161 and the reflective pixel electrode layer 180 are electrically connected with each other through the first via 151. The reflective pixel electrode layer 180 can be connected with, for example, the drain electrode of the source/drain electrode layer 161, so that the reflective pixel electrode layer 180 can serve as a pixel electrode. The reflective pixel electrode layer 180 can also reflect light so as to reflect, for example, ambient light, for performing reflection display.

For example, in the array substrate according to at least one embodiment of the present disclosure, as illustrated in FIG. 1*b*, a second via 152 is provided in the passivation layer 140 in the wiring area, and the connection electrode 160 and the contact pad 112 are electrically connected with each other through the second via 152. The specific positional relationship between the connection electrode 160 and the contact pad 112 are not limited in the embodiments of the present disclosure, as long as the connection electrode 160 and the contact pad 112 can be connected with each other through the second via 152. For example, in a direction perpendicular to the plane where the base substrate 100 is located, the connection electrode 160 and the contact pad 112 can be disposed to be at least partially overlapping each other, and the second via 152 is provided in a region of the passivation layer 140 corresponding to the overlapping portion.

For example, in the array substrate provided by at least one embodiment of the present disclosure, as illustrated in FIG. 1*b*, a third via 153 can be provided in the passivation layer 140 in the wiring area, and the connection electrode 160 and the signal line 132 are electrically connected with each other through the third via 153. For the positional relationship between the connection electrode 160 and the signal line 132, reference can be made to the related description of the positional relationship between the connection electrode 160 and the contact pad 112 in the foregoing embodiment, and it will not be elaborated here in the embodiment of the present disclosure.

For example, in the array substrate according to at least one embodiment of the present disclosure, as illustrated in FIG. 1a and FIG. 1b, a gate insulating layer 120 is further provided on the base substrate 100. A portion of the gate insulating layer 120 in the display area is disposed between the source/drain electrode layer 131 and the gate electrode layer 111, and a portion of the gate insulating layer 120 in the wiring area is disposed between the signal line 132 and the contact pad 112. Materials for preparing the gate insulating layer 120 can comprise, for example, one of silicon nitride (SiNx), silicon oxide (SiOx), aluminum oxide ($Al_2O_3$), aluminum nitride (AlN) and other suitable material, or a combination thereof. An active layer (not shown) of the thin film transistor is formed, for example, on the gate insulating layer 120. The source/drain electrode layer 131 is electrically connected with the active layer. For example, the active layer can be made of amorphous silicon, polysilicon, or oxide semiconductor, or the like.

For example, in the array substrate provided by at least one embodiment of the present disclosure, as illustrated in FIG. 1a and FIG. 1b, a fourth via 154 is provided in the gate insulating layer 120 in the wiring area. The contact pad 112 is exposed by the fourth via 154 and the fourth via 154 is communicated with the second via 152. As such, the connection electrode 160 can be electrically connected with the contact pad 112 through the second via 152 and the fourth via 154.

At least one embodiment of the present disclosure provides a manufacturing method of an array substrate, comprising: providing a base substrate which comprises a display area and a wiring area located at a periphery of the display area; forming a contact pad in the wiring area; forming a source/drain electrode layer in the display area on the base substrate; depositing a film of connection electrode layer on the base substrate and performing a patterning process to form a connection electrode in the wiring area on the base substrate, with a first photoresist layer for performing the patterning process and covering the connection electrode remained; depositing a film of reflective pixel electrode layer on the base substrate and performing a patterning process to form a reflective pixel electrode layer in the display area and to remove the film of reflective pixel electrode layer in the wiring area to expose the first photoresist layer; removing a second photoresist layer for patterning the film of reflective pixel electrode layer on the reflective pixel electrode layer and the first photoresist layer in the wiring area; wherein the reflective pixel electrode layer is electrically connected with the source/drain electrode layer, and the connection electrode is at least partially electrically connected with the contact pad. For example, the second photoresist layer on the reflective pixel electrode layer for patterning the film of reflective pixel electrode layer and the first photoresist layer in the wiring area can be removed at the same time.

Figure 2:
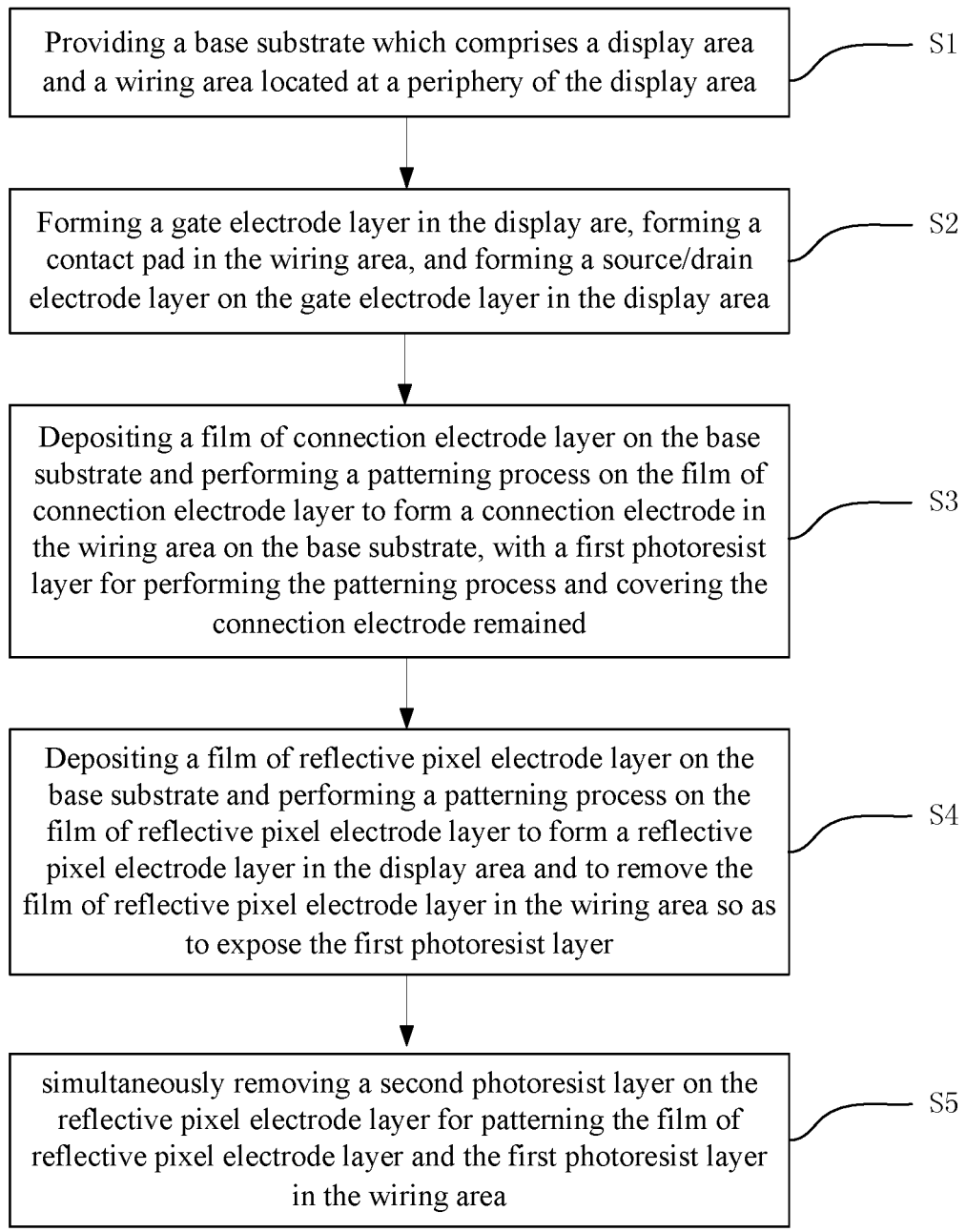
FIG. 2 is a flow chart of a manufacturing method of an array substrate provided by an embodiment of the present disclosure.

FIG. 2 is a flow chart of a manufacturing method of an array substrate according to an embodiment of the present disclosure. For example, as illustrated in FIG. 2, the manufacturing method of the array substrate according to at least one embodiment of the present disclosure can comprise the following processes:

S1: providing a base substrate which comprises a display area and a wiring area located at a periphery of the display area.

S2: forming a contact pad in the wiring area on the base substrate, and forming a source/drain electrode layer in the display area on the base substrate.

For example, in the manufacturing method according to the present embodiment, a gate electrode layer can be further formed in the display area on the base substrate. For example, the gate electrode layer can be further formed simultaneously with the contact pad, namely, the gate electrode layer and the contact pad are disposed in the same layer and can be made of the same material layer; the source/drain electrode layer can be formed simultaneously with the signal line for example, namely, the source/drain electrode layer and the signal line can be disposed in the same layer and can be made of the same material layer.

S3: depositing a film of connection electrode layer on the base substrate and performing a patterning process on the film of connection electrode layer to form a connection electrode in the wiring area on the base substrate, with a first photoresist layer for performing the patterning process and covering the connection electrode remained; a removing or peeling process of the first photoresist layer is not required, i.e., a process step of removing the first photoresist layer is saved.

S4: depositing a film of reflective pixel electrode layer on the base substrate and performing a patterning process on the film of reflective pixel electrode layer to form a reflective pixel electrode layer in the display area and to remove the film of reflective pixel electrode layer in the wiring area so as to expose the first photoresist layer.

S5: for example, simultaneously removing a second photoresist layer on the reflective pixel electrode layer for patterning the film of reflective pixel electrode layer and the first photoresist layer in the wiring area.

In the embodiment as illustrated in FIG. 2 for example, the reflective pixel electrode layer is electrically connected with the source/drain electrode layer, and the connection electrode is at least partially electrically connected with the contact pad.

For example, the manufacturing method according to at least one embodiment of the present disclosure can further comprise: forming a gate electrode layer in the display area on the base substrate. For example, in the manufacturing method according to the embodiments of the present disclosure, the gate electrode layer and the contact pad can be formed in the same layer. The process has been explained in the flow as illustrated in FIG. 2 of the above embodiment, and will not be elaborated here.

For example, the manufacturing method according to at least one embodiment of the present disclosure can further comprise: forming a passivation layer on the source/drain electrode layer on the base substrate, and then patterning the passivation layer so as to form a first via in the passivation layer in the display area, wherein the source/drain electrode layer and the reflective pixel electrode layer are electrically connected with each other through the first via, and forming a second via in the passivation layer in the wiring area, wherein the connection electrode and the contact pad are electrically connected with each other through the second via.

For example, the manufacturing method according to at least one embodiment of the present disclosure can further comprise: forming a signal line in the wiring area when forming the source/drain electrode layer on the gate electrode layer in the display area; and forming a third via in the passivation layer in the wiring area, wherein the connection electrode is electrically connected with the signal line through the third via.

For example, the manufacturing method according to at least one embodiment of the present disclosure can further comprise: forming a third via in the passivation layer, wherein the connection electrode is electrically connected with the contact pad through the third via.

For example, the manufacturing method according to at least one embodiment of the present disclosure can further comprise: forming a gate insulating layer on the gate electrode layer and the contact pad, forming the source/drain electrode layer on the gate insulating layer; a fourth via exposing the contact pad can be further formed in the gate insulating layer when the second via is formed in the passivation layer. The second via and the fourth via are communicated with each other.

For example, the manufacturing method according to at least one embodiment of the present disclosure can further comprise: forming an active layer on the gate insulating layer, and then forming the source/drain electrode layer on the active layer.

It should be noted that the specific structure of the array substrate obtained by the manufacturing method in the above embodiments of the present disclosure can be understood by referring to the related contents in the foregoing embodiments (the embodiments related to the array substrate), and it will not be elaborated here in the embodiment of the present disclosure.

To facilitate understanding, an example of at least one embodiment of the present disclosure provides a manufacturing method of an array substrate. FIG. 3a, FIG. 4a, FIG. 5a, FIG. 6a, FIG. 7a, FIG. 8a, FIG. 9a, FIG. 10a, FIG. 11a and FIG. 3b, FIG. 4b, FIG. 5b, FIG. 6b, FIG. 7b, FIG. 8b, FIG. 9b, FIG. 10b, FIG. 11b are schematic cross-sectional structural view in the manufacturing method of the array substrate in the example as illustrated in FIG. 2. FIG. 3a, FIG. 4a, FIG. 5a, FIG. 6a, FIG. 7a, FIG. 8a, FIG. 9a, FIG. 10a, FIG. 11a are schematic cross-sectional structural view of the display area in the manufacturing method of the array substrate as illustrated in FIG. 2; and FIG. 3b, FIG. 4b, FIG. 5b, FIG. 6b, FIG. 7b, FIG. 8b, FIG. 9b, FIG. 10b, FIG. 11b are schematic cross-sectional structural view of the wiring, area in the manufacturing method of the array substrate as illustrated in FIG. 2.

It should be noted that in the following examples provided by the embodiments of the present disclosure, besides the structure and the preparation process and procedure described in the present disclosure, current preparation process flow for array substrate can be adopted for other structures and preparation processes and procedures. To facilitate an explanation of the technical solutions of the present disclosure, the manufacturing method of the array substrate as illustrated in this example is a process following the preparation of the passivation layer.

Figure 3A:
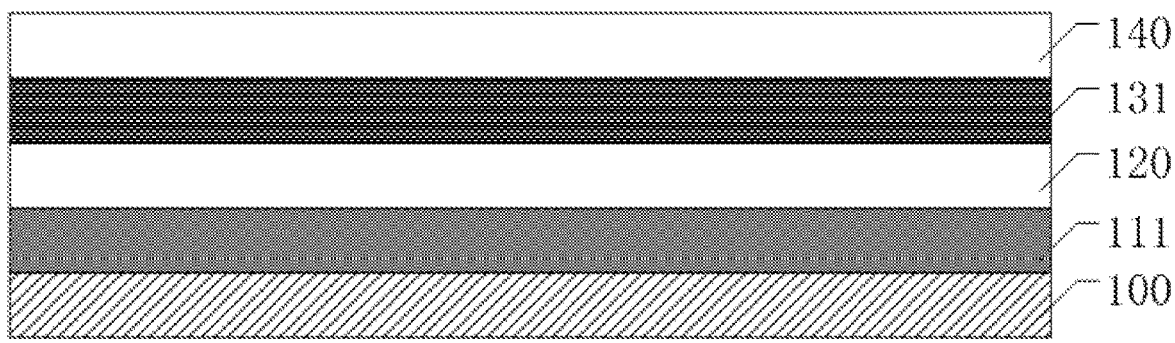
FIG. 3a, FIG. 4a, FIG. 5a, FIG. 6a, FIG. 7a, FIG. 8a, FIG. 9a, FIG. 10a, FIG. 11a are schematic cross-sectional structural views of a display area in the manufacturing method of the array substrate as illustrated in FIG. 2.
Figure 3B:
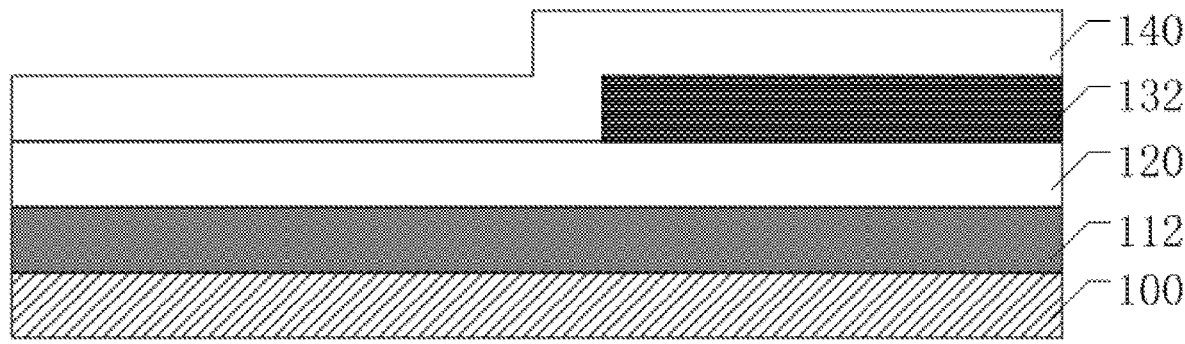
FIG. 3b, FIG. 4b, FIG. 5b, FIG. 6b, FIG. 7b, FIG. 8b, FIG. 9b, FIG. 10b, FIG. 11b are schematic cross-sectional structural views of a wiring area in the manufacturing method of the array substrate as illustrated in FIG. 2.

As illustrated in FIG. 3a, a gate electrode layer 111, a gate insulating layer 120, a source/drain electrode layer 131, and a passivation layer 140 are sequentially formed in the display area on the base substrate 100. As illustrated in FIG. 3b, a contact pad 112, a gate insulating layer 120, a signal line 132, and a passivation layer 140 are sequentially formed in the wiring area on the base substrate 100. For example, the base substrate 100 can be a glass substrate. For example, the contact pad 112 can be provided in the same layer as the gate electrode layer 111 and formed by the same patterning process as the gate electrode layer 111. The signal line 132 can be provided in the same layer as the source/drain electrode layer 131 and formed by the same patterning process as the source/drain electrode layer 131, for example.

For example, an exemplary manufacturing method for forming the partial structure of a thin film transistor can comprise: depositing a film of gate electrode layer on the base substrate, and performing a patterning process on the film of gate electrode layer to form a gate electrode layer in the display area, and forming a contact pad in the wiring area. A gate insulating layer is deposited on the base substrate on which the gate electrode layer is formed. A film of active layer is deposited on the gate insulating layer and is subjected to a patterning process so as to form an active layer. For example, materials for preparing the active layer can comprise amorphous silicon, polysilicon, and metal oxides such as indium gallium zinc oxide (IGZO), indium zinc oxide (IZO), zinc oxide (ZnO), gallium zinc oxide (GZO), and the like.

A film of source/drain electrode layer is deposited on the base substrate on which the active layer is formed, and is subjected to a patterning process so as to form a source/drain electrode layer in the display area, and a signal line is formed in the wiring area. A passivation layer is deposited on the base substrate on which the source/drain electrode layer and the signal line are formed.

Figure 4A:
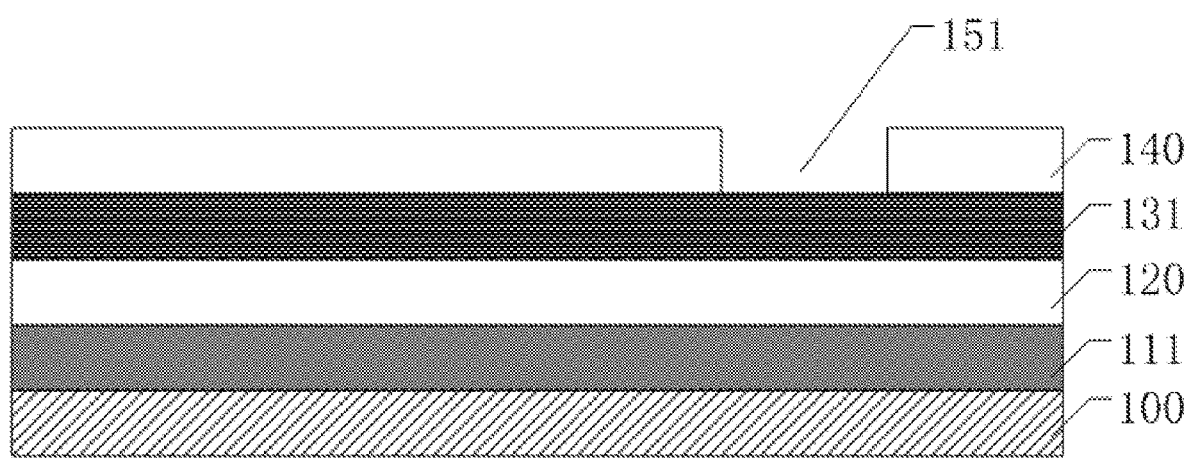
Figure 4B:
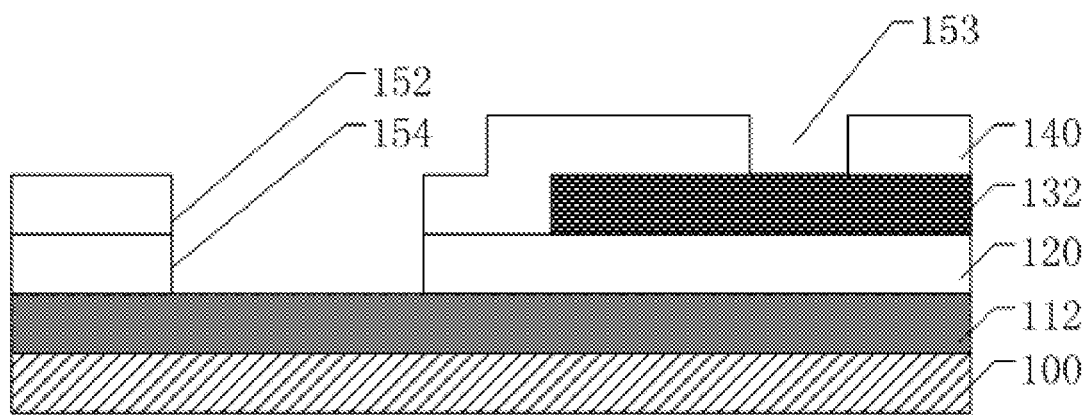

As illustrated in FIG. 4a, a first via 151 is formed in the passivation layer 140 in the display area on the base substrate 100 through a patterning process; as illustrated in FIG. 4b, a second via 152 and a third via 153 are formed in the passivation layer 140 in the wiring area on the base substrate 100 through a patterning process. The first via 151, the second via 152, and the third via 153 can be formed through the same patterning process.

For example, a fourth via 154 is formed in the gate insulating layer 120 in the wiring area at a position of the second via 152. The fourth via 154 and the second via 152 are communicated with each other. The second via 152 and the fourth via 154 expose the contact pad 112. It should be noted that the second via 152 and the fourth via 154 can be simultaneously formed for example through one patterning process; for example, the second via 152 and the fourth via 154 can further be formed separately, that is, after forming the gate insulating layer 120, the fourth via 154 is formed in the gate insulating layer 120 so as to expose the contact pad 112, and then after forming the passivation layer 153, the second via 152 communicated with the fourth via 154 is formed in the passivation layer 153.

In at least one embodiment of the present disclosure, the patterning process can be, for example, a photolithographic patterning process, which can comprise, for example, applying a photoresist layer on a structure layer that needs to be patterned, exposing the photoresist layer through a mask, developing the exposed photoresist layer to obtain a photoresist pattern, etching the structure layer by the photoresist pattern, and then optionally removing the photoresist pattern.

Figure 5A:
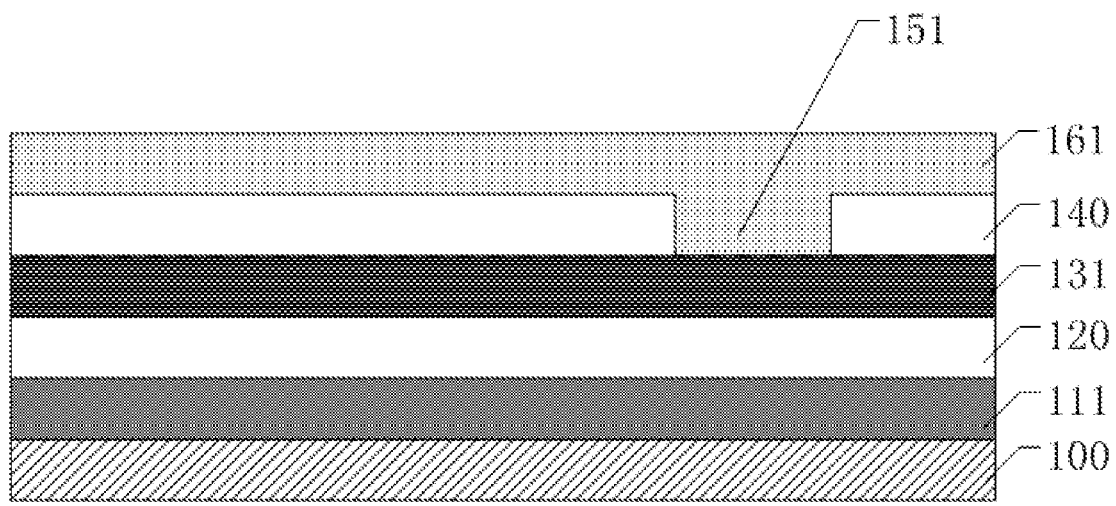
Figure 5B:
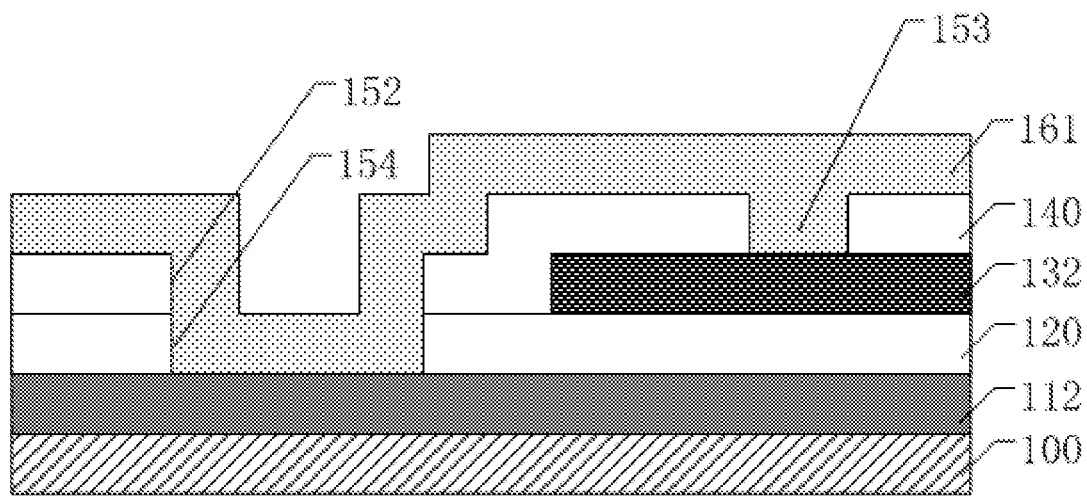

As illustrated in FIG. 5a, a film of connection electrode layer 161 is deposited in the display area on the base substrate 100; as illustrated in FIG. 5b, a film of connection electrode layer 161 is deposited in the wiring area on the base substrate 100. The film of connection electrode layer 161 is electrically connected with the signal line through the third via 153; and the film of connection electrode layer 161 is electrically connected with the contact pad 112 through the second via 152. For example, in case that the fourth via 154 is formed, the film of connection electrode layer 161 can be electrically connected with the contact pad 112 through the second via 152 and the fourth via 154.

Figure 6A:
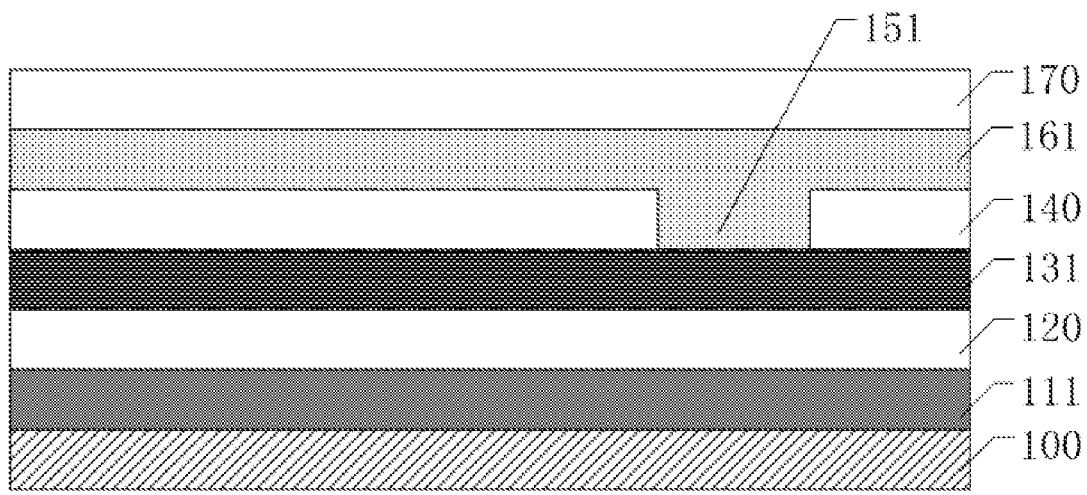
Figure 6B:
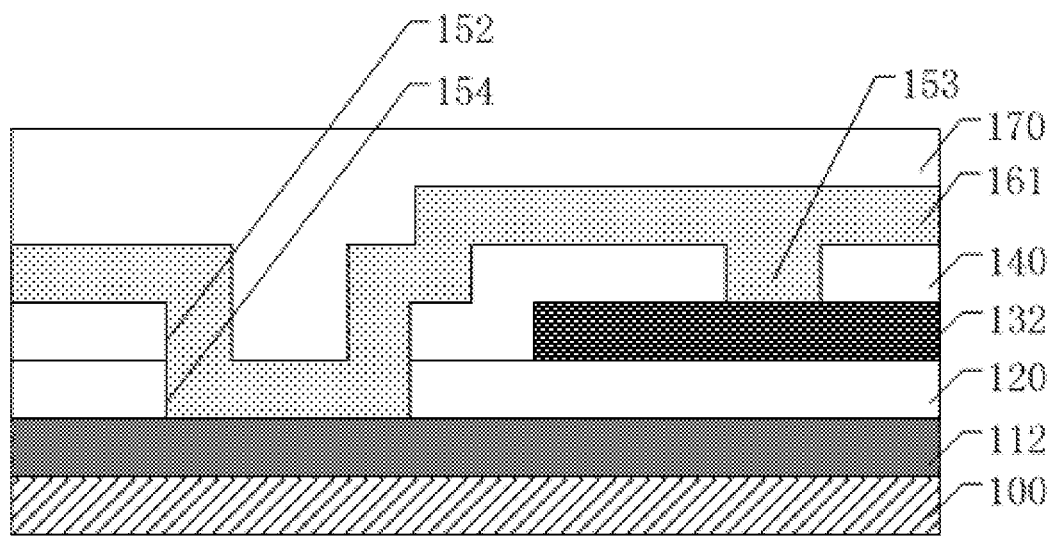

As illustrated in FIG. 6a, a first photoresist layer 170 is applied on the film of connection electrode layer 161 in the display area; and a first photoresist layer 170 is applied on the film of connection electrode layer 161 in the wiring area.

Figure 7A:
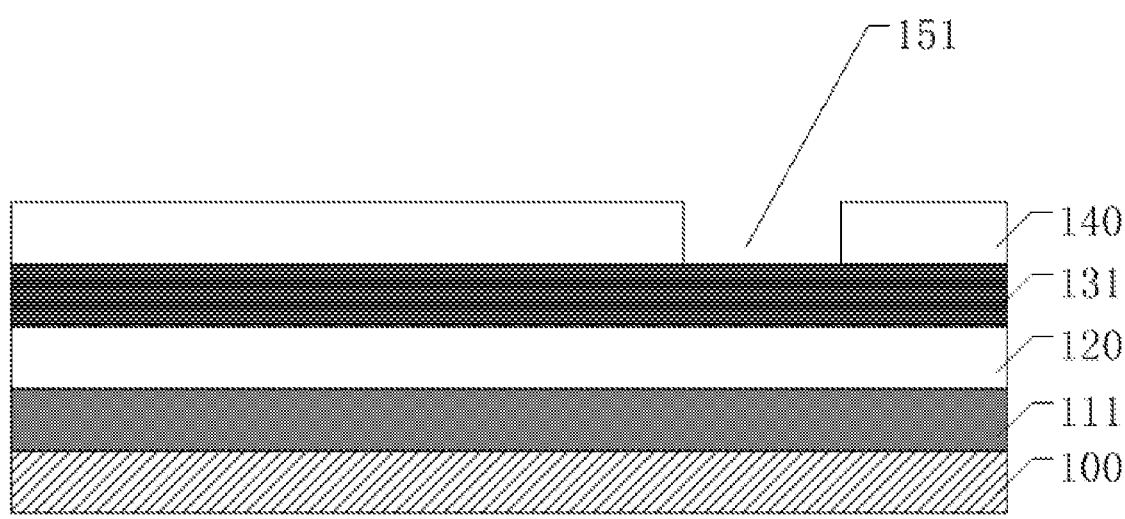
Figure 7B:
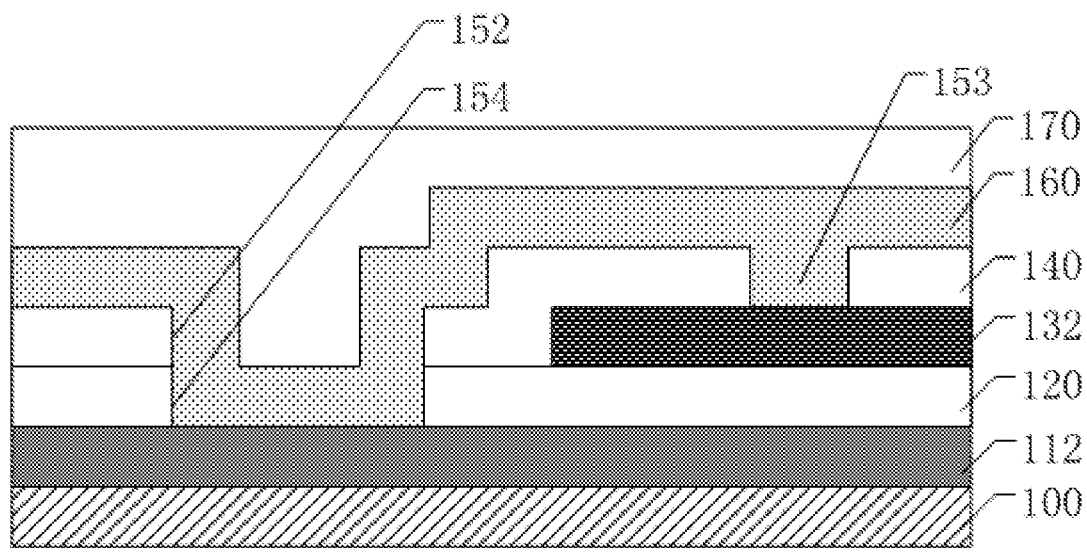

As illustrated in FIG. 7a and FIG. 7b, a patterning process is performed on the film of connection electrode layer 161 in the display area and the wiring area so as to form the connection electrode 160 in the wiring area. For example, by processes of exposing, developing, etching and the like, the film of connection electrode layer 161 and the first photoresist layer 170 in the display area are removed, and the first photoresist layer 170 on the connection electrode 160 in the wiring area is remained. That is to say, a removing process for the first photoresist layer 170 after the patterning process is not required.

Figure 8A:
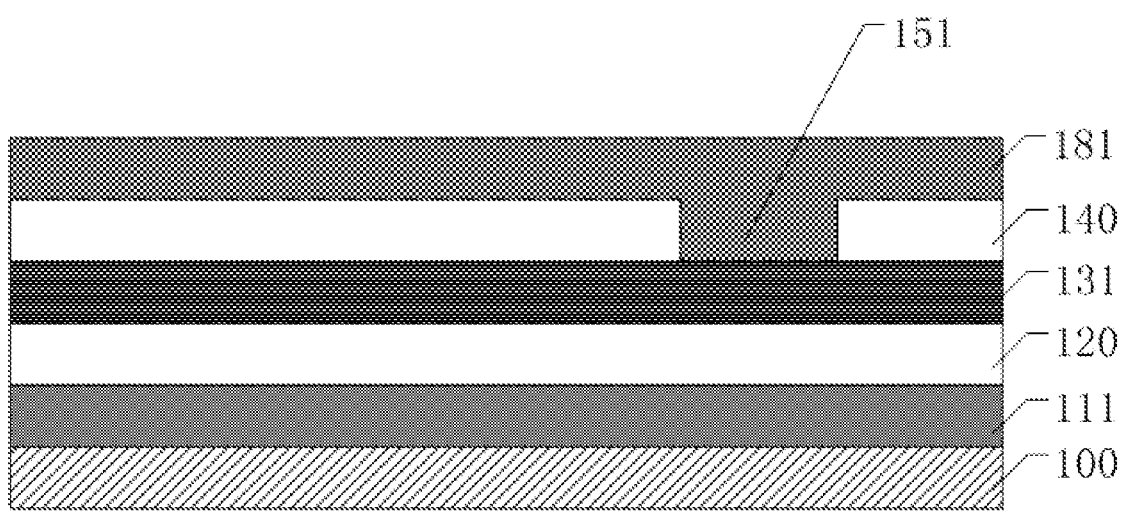
Figure 8B:
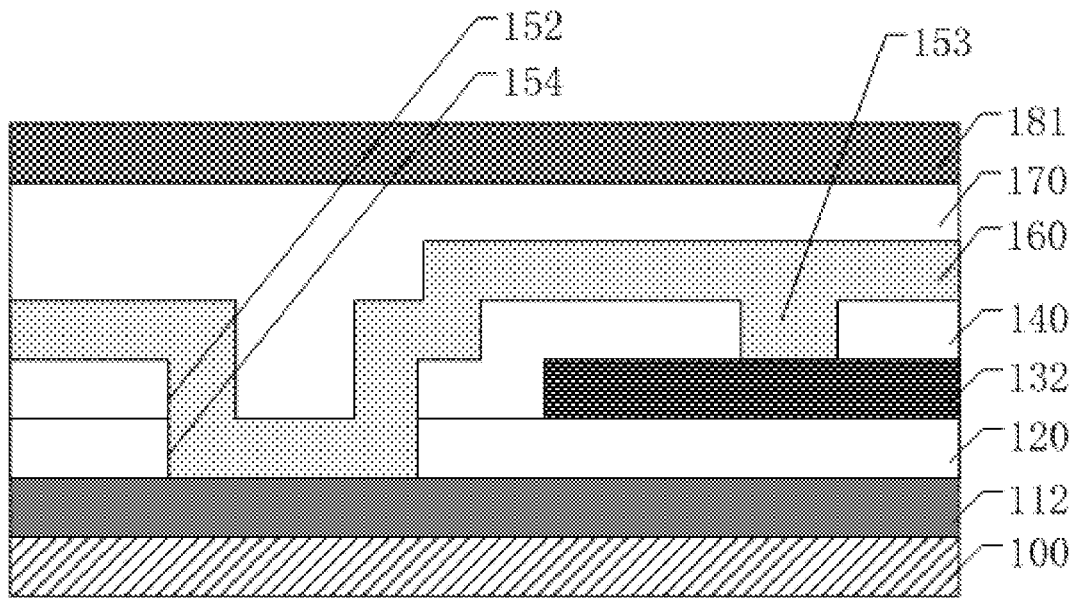

As illustrated in FIG. 8a and FIG. 8b, a film of reflective pixel electrode layer 181 is deposited in both the display area and the wiring area on the base substrate 100. The film of reflective pixel electrode layer 181 and the source/drain electrode layer 131 in the display area are electrically connected with each other through the first via 151.

Figure 9A:
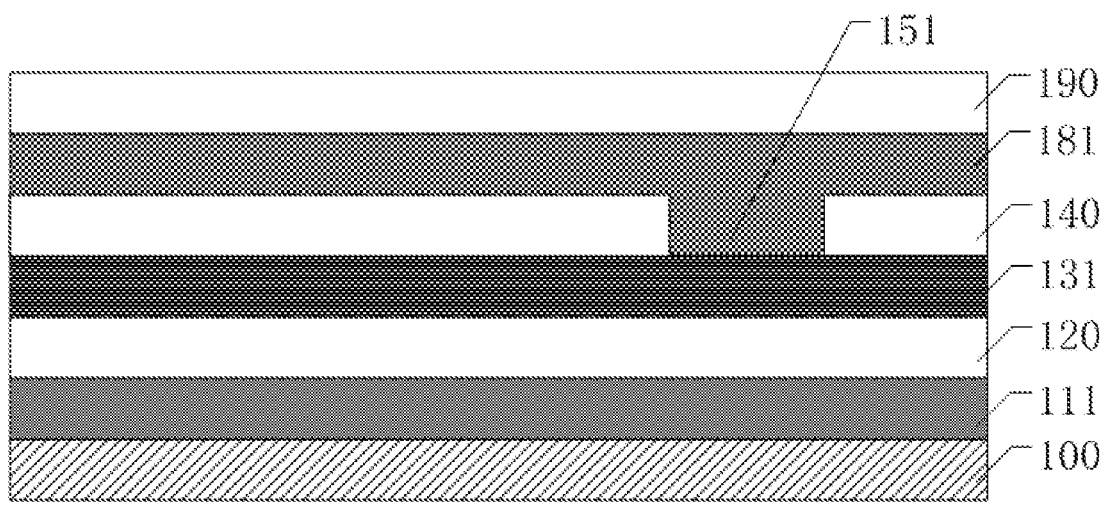
Figure 9B:
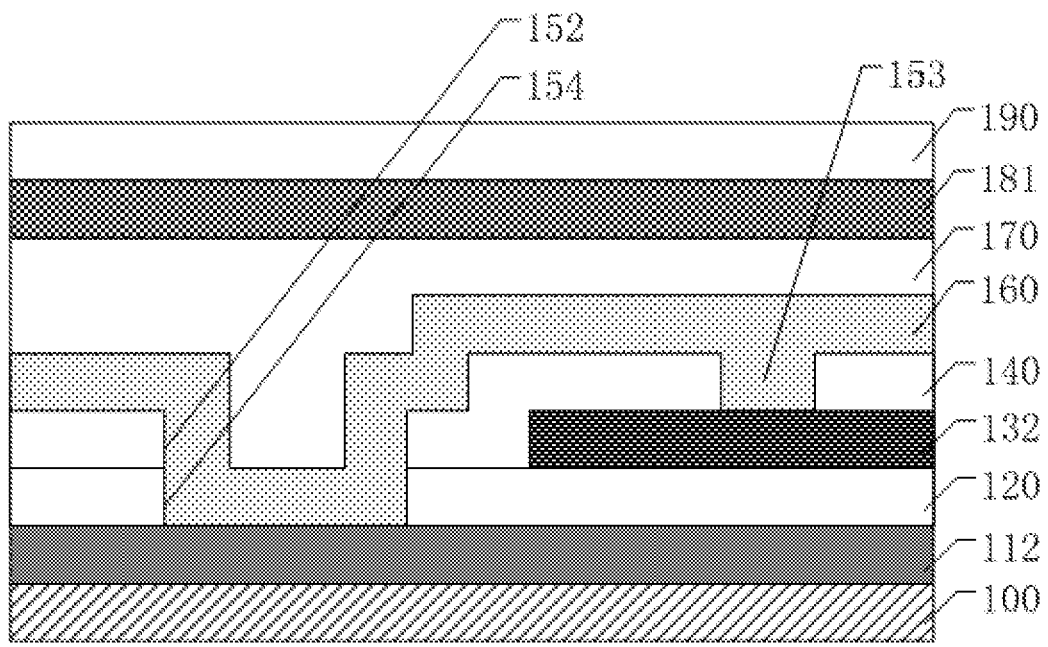

As illustrated in FIG. 9a and FIG. 9b, a second photoresist layer 190 is deposited both in the display area and the wiring area on the film of reflective pixel electrode layer 181.

Figure 10A:
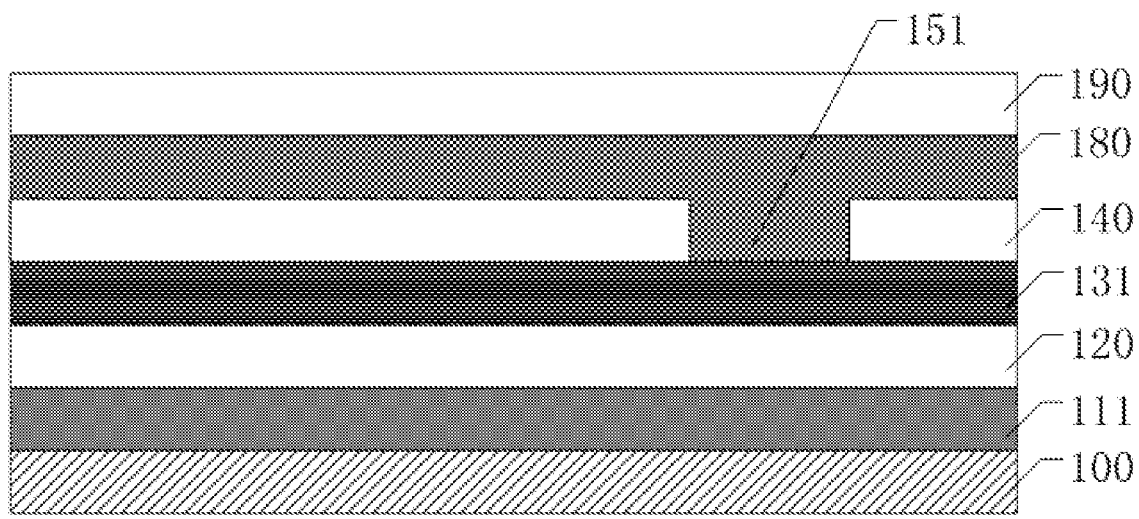
Figure 10B:
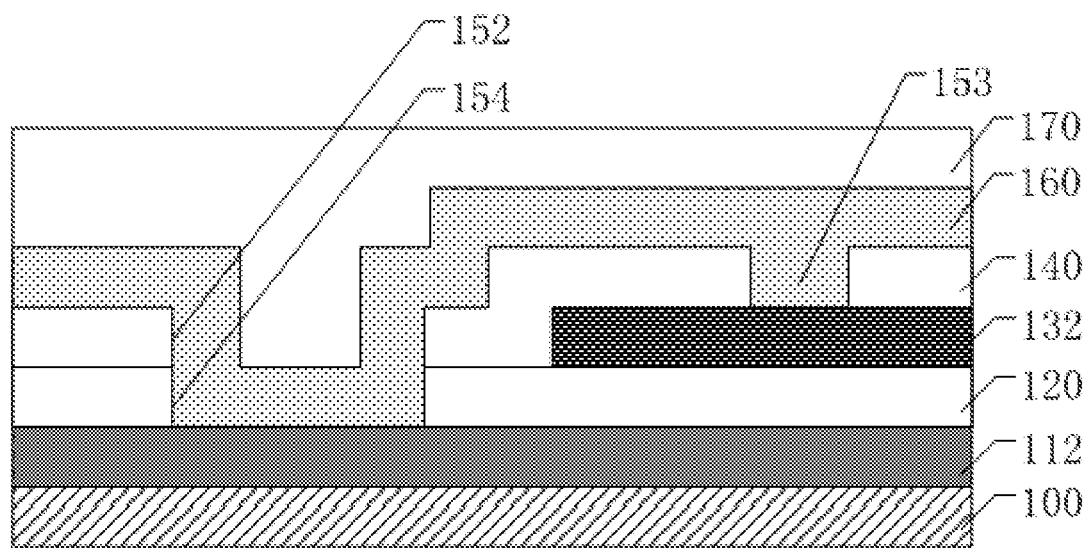

As illustrated in FIG. 10a and FIG. 10b, a patterning process is performed on the films of reflective pixel electrode layer 181 in both the display area and the wiring area so as to form the reflective pixel electrode layer 180 in the display area, and the film of reflective pixel electrode layer 181 in the wiring area is, for example, etched away.

In the process of, for example, etching the thin film of reflective pixel electrode layer 181, since the connection electrode at the second via and the third via is covered with the first photoresist layer, the corrosion solution will not enter the second via and the third via. Thus, the contact pad or the signal line will not be corroded.

Figure 11A:
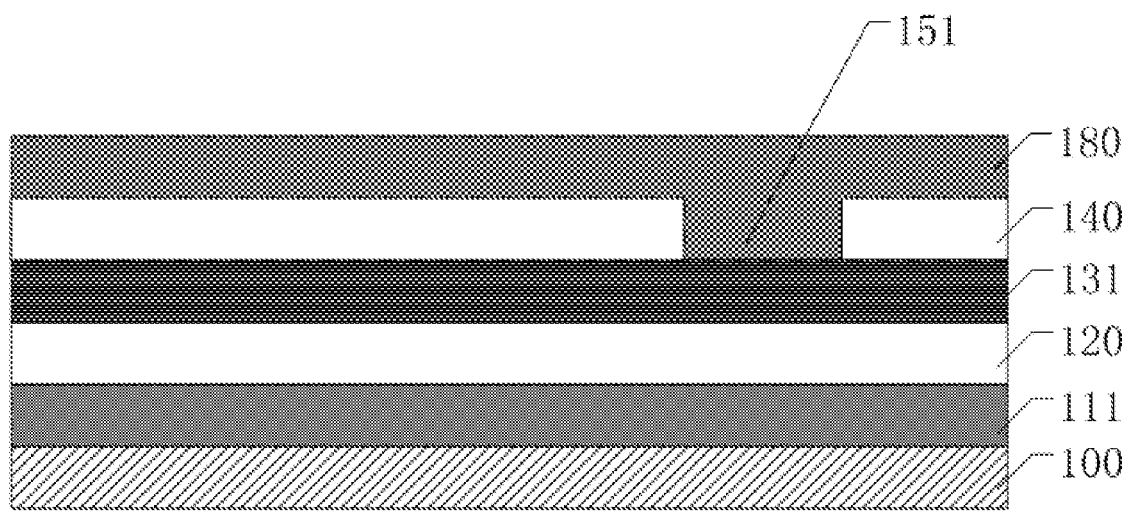
Figure 11B:
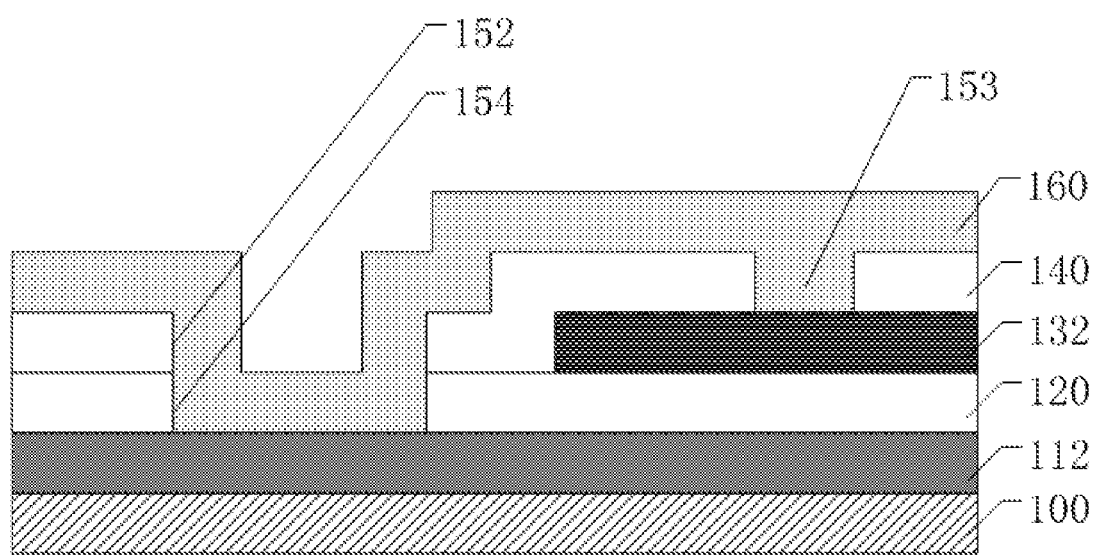

As illustrated in FIG. 11a and FIG. 11b, the second photoresist layer in the display area and the first photoresist layer in the wiring area are removed. The first photoresist layer and the second photoresist layer are removed together through one cleaning process, which simplifies the preparation process while ensuring the connection of the signal line of the array substrate.

It should be noted that in at least one embodiment of the present disclosure, the process steps for the display area and the wiring area can be performed simultaneously. For example, during the process of depositing the film of connection electrode layer, the film of connection electrode layer can be deposited in both the display area and the wiring area on the base substrate at the same time. Likewise, a patterning process being performed on the film of connection electrode layer, means that a patterning process is performed on the thin film of connection electrode layer in both the display area and the wiring area at the same time.

At least one embodiment of the present disclosure provides a display panel comprising the array substrate according to any one of the above embodiments.

One example of the display panel is a liquid crystal display panel comprising an array substrate and an opposite substrate, which are disposed opposite to each other to form a liquid crystal cell in which a liquid crystal material is filled. The opposite substrate is, for example, a color filter substrate. The reflective pixel electrode layer of each pixel unit of the array substrate is configured to apply an electric field to control the degree of rotation of the liquid crystal material so as to perform a display operation.

For example, the type of the liquid crystal panel can comprise a TN type (Twisted Nematic) display panel, a VA type (Vertical Alignment) display panel, or an IPS type (In-Plane Switching) display panel, and etc., which are not restricted in the embodiments of the present disclosure.

Another example of the display panel is an electronic paper display panel in which an electronic ink layer is formed on an array substrate, and a reflective pixel electrode layer of each pixel unit serves to apply a voltage to drive the charged microparticles in the electronic ink to move so as to perform a display operation.

The embodiments of the present disclosure provide an array substrate, a method of manufacturing the same, a display panel, and have at least one of the following advantageous effects:

(1) At least one embodiment of the present disclosure provides an array substrate, a method for manufacturing the same, and a display panel, wherein the reflective pixel electrode layer in a display area of the array substrate has both functions of being a pixel electrode and being reflective, which improves light reflectivity.

(2) In at least one embodiment of the present disclosure, in the process of forming the reflective pixel electrode layer in the display area, the connection electrode in the wiring area is still covered by the first photoresist layer, thereby preventing the corrosion solution for preparing the reflective pixel electrode layer from penetrating the connection electrode and corroding the contact pad or the signal line.

(3) In at least one embodiment of the present disclosure, the first photoresist layer for preparing the connection electrode in the wiring area is removed along with the second photoresist layer for preparing the reflective pixel electrode layer in the display area, so that a separate cleaning process for the first photoresist layer can be saved and the cost can be reduced.

For the present disclosure, the following points need to be noted:

(1) The drawings of the embodiments of the present disclosure merely relate to the structures involved in the embodiments of the present disclosure, and one of ordinary skill in the art can refer to conventional designs for other structures.

(2) For the sake of clarity, in the drawings depicting the embodiments of the present disclosure, the thicknesses of layers or regions are enlarged or decreased, that is, these drawings are not drawn in actual scale.

(3) In the case of no conflict, the embodiments of the present disclosure and the features in the embodiments can be combined with each other so as to obtain a new embodiment.

The foregoing are merely exemplary embodiments of the disclosure, but the scope of protection of the present disclosure is not limited thereto. The protection scope of the disclosure shall be defined by the attached claims.

The invention claimed is:

1. A manufacturing method of array substrate, comprising:
   providing a base substrate which comprises a display area and a wiring area located at a periphery of the display area;
   forming a contact pad in the wiring area;
   forming a source/drain electrode layer in the display area on the base substrate;
   depositing a film of connection electrode layer on the base substrate and performing a patterning process on the film of connection electrode layer to form a connection electrode in the wiring area on the base substrate, with a first photoresist layer for performing the patterning process and covering the connection electrode remained;

depositing a film of reflective pixel electrode layer on the base substrate, performing a patterning process on the film of reflective pixel electrode layer to form a reflective pixel electrode layer in the display area, and removing the film of reflective pixel electrode layer in the wiring area to expose the first photoresist layer; and removing a second photoresist layer for patterning the film of reflective pixel electrode layer on the reflective pixel electrode layer and the first photoresist layer in the wiring area;

wherein the reflective pixel electrode layer is electrically connected with the source/drain electrode layer, and the connection electrode is at least partially electrically connected with the contact pad.

2. The manufacturing method according to claim 1, further comprising:

forming a passivation layer on the source/drain electrode layer on the base substrate, and then patterning the passivation layer so as to form in the passivation layer a first via located in the display area and a second via located in the wiring area;

wherein the source/drain electrode layer and the reflective pixel electrode layer are electrically connected with each other through the first via, and the connection electrode and the contact pad are electrically connected with each other through the second via.

3. The manufacturing method according to claim 2, further comprising:

forming a signal line in the wiring area when forming the source/drain electrode layer on a gate electrode in the display are; and forming a third via in the passivation layer in the wiring area, the connection electrode being electrically connected with the signal line through the third via.

4. The manufacturing method according to claim 3, wherein the signal line is formed to be electrically connected with the contact pad through the connection electrode.

5. The manufacturing method according to claim 3, wherein the signal line is formed to be at least one of a gate line, a data line, a common electrode line, a power line, a ground line, a frame start scan line, and a reset line.

6. The manufacturing method according to claim 4, further comprising: forming a gate insulating layer on the contact pad, the source/drain electrode layer being formed on the gate insulating layer; and forming a fourth via in the gate insulating layer exposing the contact pad when forming the second via in the passivation layer, the connection electrode being electrically connected with the contact pad through the second via and the fourth via.

7. The manufacturing method according to claim 1, further comprising: forming a gate electrode layer in the display area on the base substrate, and forming the gate electrode layer and the contact pad through one patterning process.

8. An array substrate manufactured by the method according to claim 1, comprising:

the base substrate comprising the display area and the wiring area located at the periphery of the display area;

a gate electrode layer located on the base substrate in the display area;

the source/drain electrode layer located on the base substrate in the display area;

the reflective pixel electrode layer located in the display area and provided on the source/drain electrode layer;

the contact pad located in the wiring area; and the connection electrode located in the wiring area, the connection electrode being provided on the contact pad;

wherein the reflective pixel electrode layer is electrically connected with the source/drain electrode layer, the connection electrode is at least partially electrically connected with the contact pad, and the reflective pixel electrode layer and the connection electrode are made of different materials.

9. The array substrate according to claim 8, wherein material of the connection electrode comprises a transparent conductive material.

10. The array substrate according to claim 8, further comprising a passivation layer disposed on the base substrate, wherein a portion of the passivation layer in the display area is positioned between the reflective pixel electrode layer and the source/drain electrode layer, and a portion of the passivation layer in the wiring area is positioned between the connection electrode and the contact pad.

11. The array substrate according to claim 10, wherein a first via is provided in the passivation layer in the display area, and the source/drain electrode layer and the reflective pixel electrode layer are electrically connected with each other through the first via, and a second via is provided in the passivation layer in the wiring area, and the connection electrode is formed on the passivation layer and is electrically connected with the contact pad through the second via.

12. The array substrate according to claim 10, further comprising a signal line disposed between the passivation layer and the base substrate in the wiring area, wherein a third via is provided in the passivation layer in the wiring area, and the connection electrode is electrically connected with the signal line through the third via.

13. The array substrate according to claim 12, wherein the source/drain electrode layer and the signal line are provided in the same layer.

14. The array substrate according to claim 12, further comprising a gate insulating layer provided on the base substrate, wherein the gate insulating layer located in the display area is disposed between a gate electrode layer and the source/drain electrode layer, and the gate insulating layer located in the wiring area is disposed between the contact pad and the signal line.

15. The array substrate according to claim 14, wherein a fourth via is provided in the gate insulating layer in the wiring area, the fourth via exposes the contact pad and is communicated with the second via, and the connection electrode is electrically connected with the contact pad through the second via and the fourth via.

16. The array substrate according to claim 8, wherein the gate electrode layer is further formed in the display area on the base substrate, and the gate electrode layer and the contact pad are disposed in the same layer.

17. A display panel, comprising the array substrate according to claim 8.

18. The manufacturing method according to claim 5, further comprising: forming a gate insulating layer on the contact pad, the source/drain electrode layer being formed on the gate insulating layer; and forming a fourth via in the gate insulating layer exposing the contact pad when forming the second via in the passivation layer, the connection electrode being electrically connected with the contact pad through the second via and the fourth via.

* * * * *